United States Patent
Huang et al.

(10) Patent No.: US 7,163,110 B2
(45) Date of Patent: Jan. 16, 2007

(54) ADJUSTABLE CASSETTE FOR ACCOMMODATING SUBSTRATES AND METHOD FOR ADJUSTING SAME

(75) Inventors: Chun-Kai Huang, Shinjuang (TW); Ming-Hui Chang, Miaolih (TW)

(73) Assignee: Foxsemicon Integrated Technology, Inc., Miao-Li (TW)

( * ) Notice: Subject to any disclaimer, the term of this patent is extended or adjusted under 35 U.S.C. 154(b) by 271 days.

(21) Appl. No.: 10/605,997

(22) Filed: Nov. 12, 2003

(65) Prior Publication Data
US 2004/0134831 A1    Jul. 15, 2004

(30) Foreign Application Priority Data
Nov. 13, 2002    (TW) .................................. 91218165

(51) Int. Cl.
*A47G 19/08*    (2006.01)
(52) U.S. Cl. ................................................. 211/41.18
(58) Field of Classification Search ............... 21/41.18; 414/810, 811, 937, 938; 206/710, 711
See application file for complete search history.

(56) References Cited

U.S. PATENT DOCUMENTS

| | | | | |
|---|---|---|---|---|
| 4,936,472 A | * | 6/1990 | Meier | 211/194 |
| 5,490,011 A | * | 2/1996 | Pernick et al. | 359/601 |
| 5,577,621 A | * | 11/1996 | Yi | 211/41.18 |
| 5,584,401 A | | 12/1996 | Yoshida | |
| 5,828,502 A | * | 10/1998 | Afshari | 359/819 |
| 6,092,981 A | * | 7/2000 | Pfeiffer et al. | 414/810 |
| 6,155,436 A | * | 12/2000 | Smick et al. | 211/41.18 |
| 6,170,675 B1 | * | 1/2001 | Follman et al. | 211/41.1 |
| 6,523,701 B1 | | 2/2003 | Yoshida et al. | |
| 7,001,130 B1 | * | 2/2006 | Ransom | 414/416.08 |

* cited by examiner

*Primary Examiner*—Sarah Purol
(74) *Attorney, Agent, or Firm*—Wei Te Chung

(57) ABSTRACT

An adjustable cassette (1) for accommodating substrates includes a frame (10), a pair of supporting plate (20) with a plurality of retaining members (208) facing each other, and an adjusting means for joining of the supporting plates to the frames and thereby forming the cassette. At least one supporting plate can slide away from or close to another supporting plate and be fixed by means of the adjusting means.

18 Claims, 5 Drawing Sheets

ADJUSTABLE CASSETTE FOR ACCOMMODATING SUBSTRATES AND METHOD FOR ADJUSTING SAME

BACKGROUND OF INVENTION

1. Field of the Invention

The present invention relates to a storage cassette, and more particularly to a cassette which can be adjusted to adapt to substrates having different sizes.

2. Description of Related Art

In handling substrates such as glass substrates for LCDs, cassettes are useful for holding and stowing the substrates and keeping them from contacting each other. The substrates are thus protected from damaging each other. In a manufacturing plant, substrates having different sizes may be produced. Thus, a cassette which can be used to hold or stow different substrates is more versatile and reduces costs.

A conventional adjustable cassette is described in Japan Yodogawa Kasei publication number H03-273664. The cassette comprises a pair of frames and a group of supporting columns. Each supporting column is provided with a plurality of annular slots defined in a rod made from resin, and defines a threaded hole in each of two opposite ends thereof.

For adapting to different sized substrates, the frames are panels which define a plurality of holes in different places for joining of the frames to the supporting columns using screws and thereby forming the cassette. According to the size of the substrates to be stowed, the supporting columns are locatable at different positions to form different spaces for accommodating different substrates. To adjust the cassette, a tool such as a screwdriveris needed to unfasten and refasten the screws. In addition, every part must be disassembled and then reassembled. The disassembly and reassembly are troublesome and timeconsuming. Moreover, the unfastened screws are liable to be lost.

For the above reasons, a new cassette which is readily adjusted to adapt to different sized substrates is desired.

SUMMARY OF INVENTION

An object of the invention is to provide a cassette which is readily adjusted to adapt to different sized substrates.

In order to achieve the object set forth above, the present invention provides an adjustable cassette for accommodating substrates includes a frame, a pair of supporting plate with a plurality of retaining members facing each other, and an adjusting means for joining of the supporting plates to the frames and thereby forming the cassette. At least one supporting plate can slide away from or close to another supporting plate and be fixed by means of the adjusting means.

The adjusting means comprises two guiding slots and two positioning slots with keyways defined in each of two opposite sides of the frame, two threaded holes and two through holes defined in each of opposite end portions thereof corresponding to the guiding slots and the positioning slots respectively, a plurality of screw bolts passed through the guiding slots and engaged in corresponding threaded holes, and a plurality of positioning pins located in the through holes and positioning slots.

Further, the present invention provides a method for adjusting an adjustable cassette, the method comprising: providing a cassette comprising upper and lower supports with guiding slots and keyways, supporting plates, positioning pins having coil springs therearound, and screw bolts; unscrewing screw bolts slightly so that they are slidable along guiding slots; pressing heads of positioning pins so that stoppers are disengaged from keyways; sliding one supporting plate along upper and lower supports until the distance between supporting plates corresponds to the size of the substrate; releasing pressure on the heads so that coil springs decompress and drive the stoppers to engage in appropriate selected keyways; and tightening the screw bolts.

When the size of a substrate is larger or smaller than the distance between the two opposing supporting plates, the cassette can be adjusted to fit the substrate. In the adjusting process, only one of the two supporting plates needs to be repositioned, and no part need be detached from the cassette. The risk of misplacing loose parts is eliminated, and the adjusting process is simple and speedy.

Other objects, advantages and novel features of the invention will become more apparent from the following detailed description of the preferred embodiment of the invention as illustrated in the accompanying drawings, in which:

DETAILED DESCRIPTION

Reference will be made to the drawings to describe the invention in detail.

Figure 1:
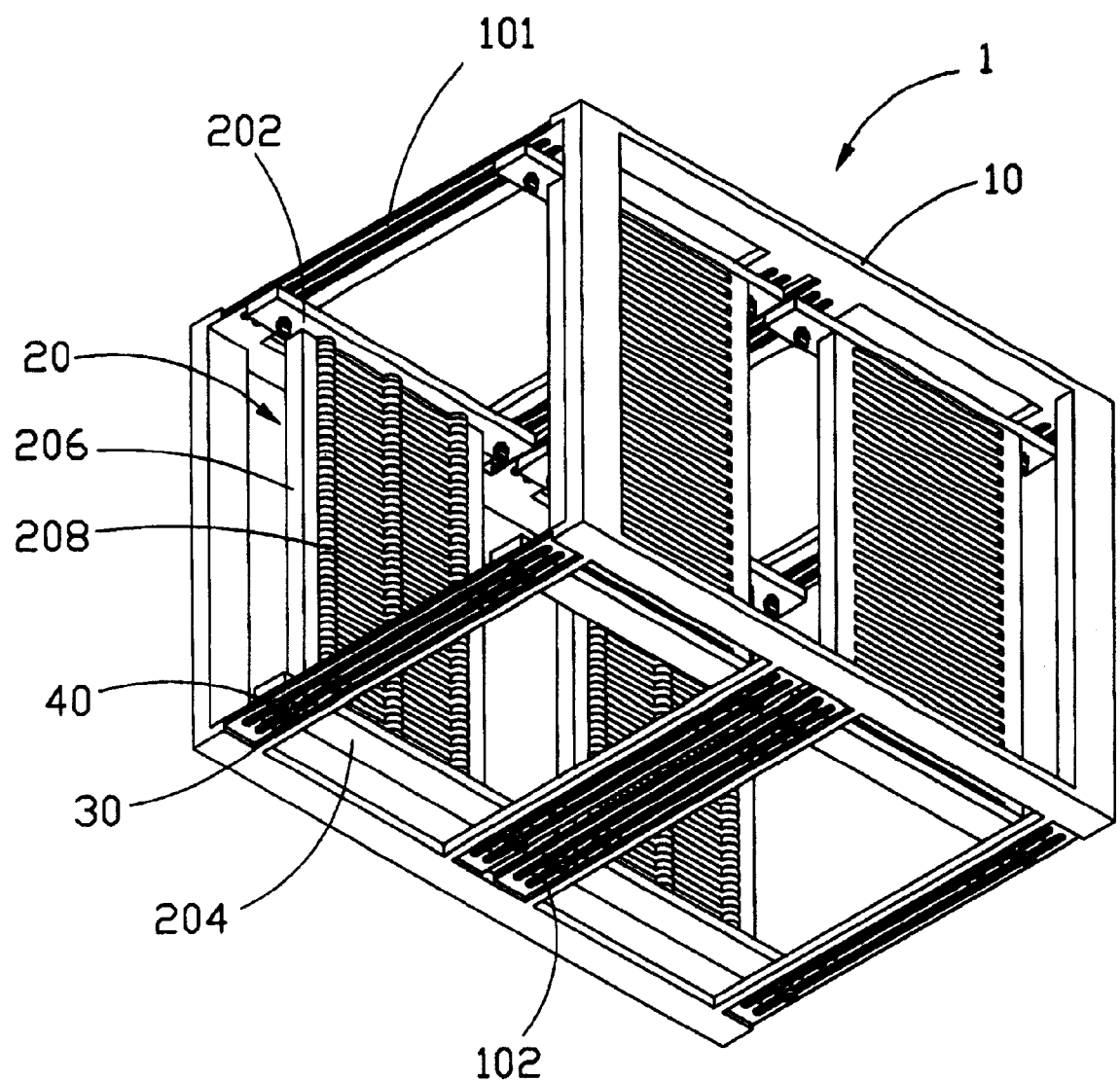
FIG. 1 is an isometric view of a cassette according to the present invention.

Referring to FIG. 1, a cassette 1 comprises a frame 10, two pairs of supporting plates 20, a plurality of positioning pins 30, a plurality of coil springs 50, and a plurality of screw bolts 40. The frame 10 and the supporting plates 20 define a space therebetween for accommodating substrates, and further define an entrance for inserting the substrates into the space.

Figure 2:
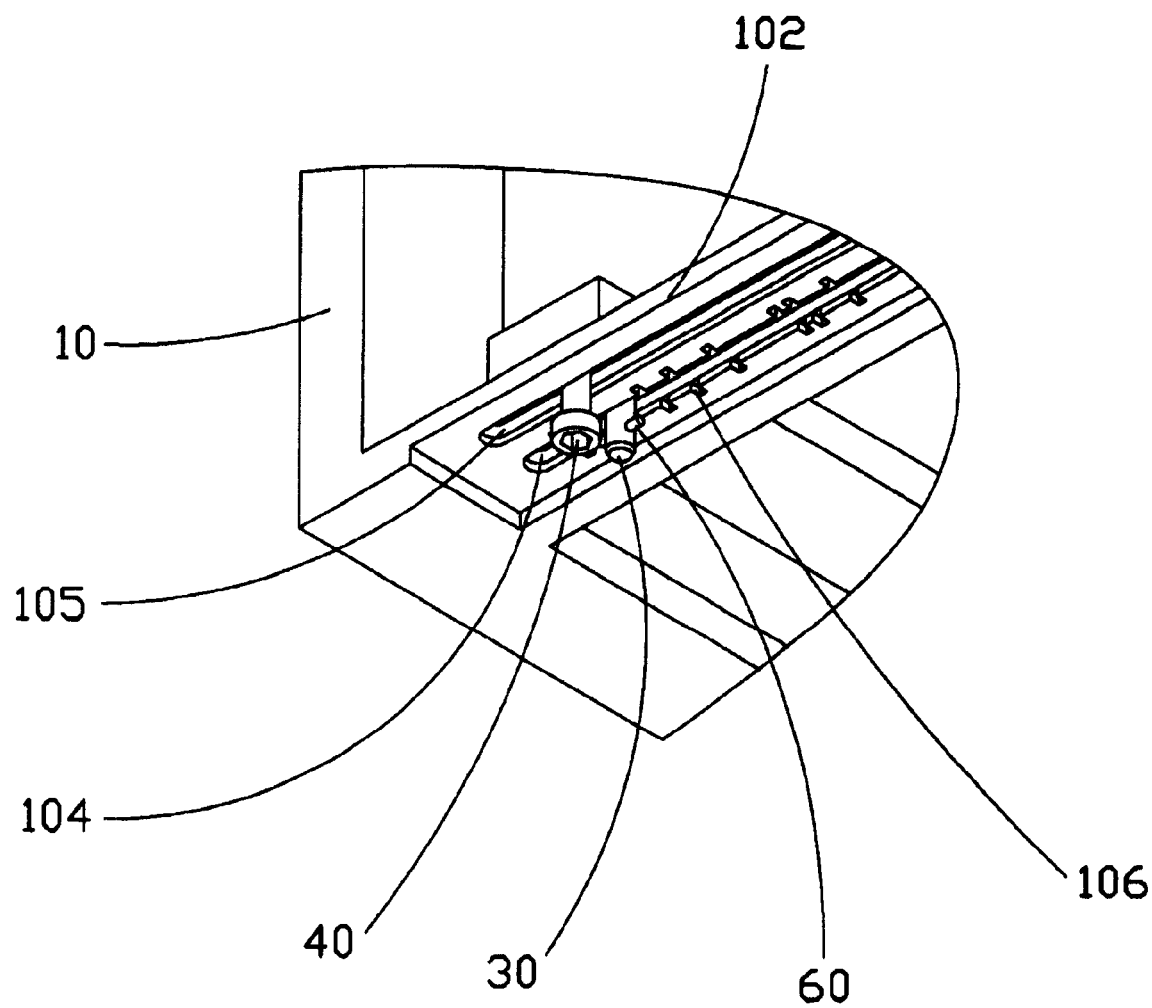
FIG. 2 is an enlarged view of a portion of the cassette of FIG. 1, showing a screw bolt partly unscrewed and a stopper disengaged from a corresponding pair of keyways.
Figure 3:
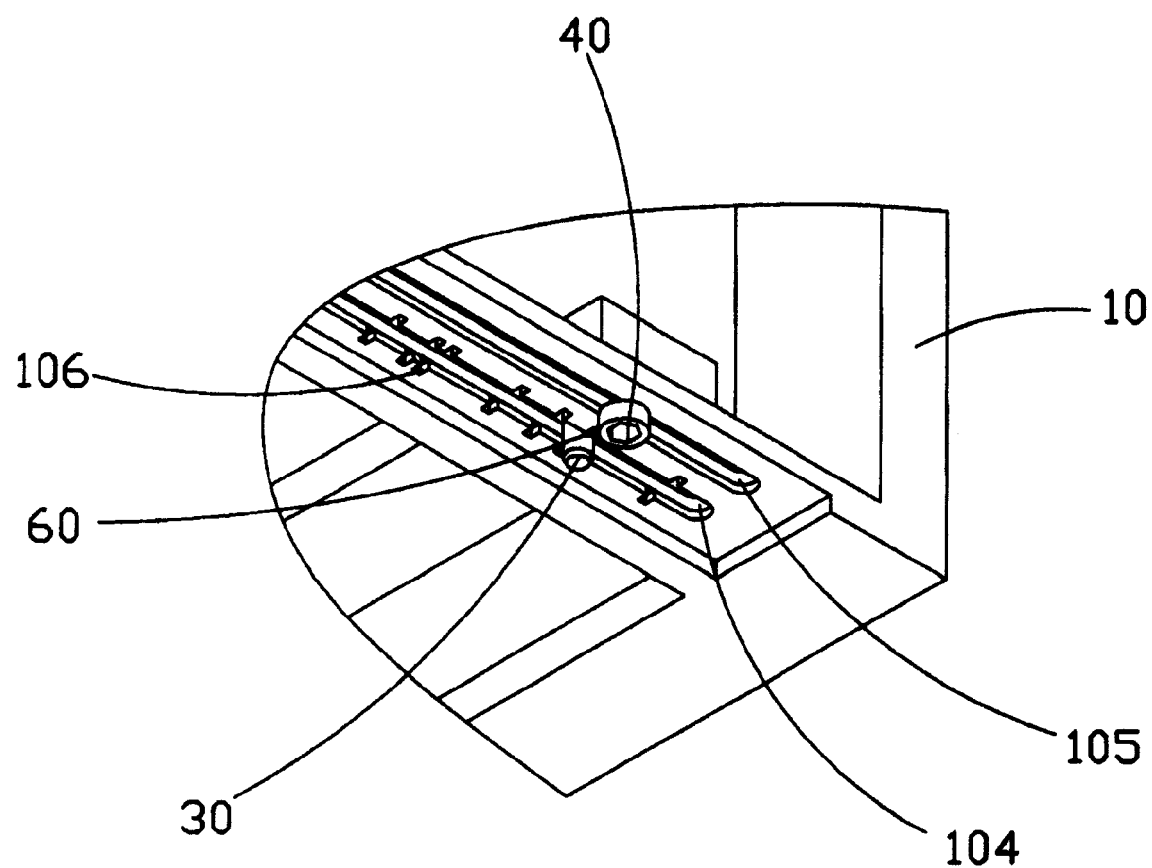
FIG. 3 is an enlarged, isometric view of another portion of the cassette of FIG. 1, showing a screw bolt screwed in and a stopper engaged in a corresponding pair of keyways.

The frame 10 is generally box-shaped, and comprises a group of upper supports 101 and a group of lower supports 102 at two opposite sides thereof respectively. The upper supports 101 and the lower supports 102 have a same structure. Referring also to FIGS. 2 and 3, each lower support 102 defines a longitudinal guiding slot 105 and a longitudinal positioning slot 104 therein, the guiding slot 105 and the positioning slot 104 being parallel to each other. Furthermore, the positioning slot 104 comprises a plurality of pairs of keyways 106 at an outer surface of the lower support 102. Each pair of keyways 106 is at opposite sides of the positioning slot 104 respectively. The pairs of keyways 106 are spaced apart from one another at predetermined distances.

Figure 4:
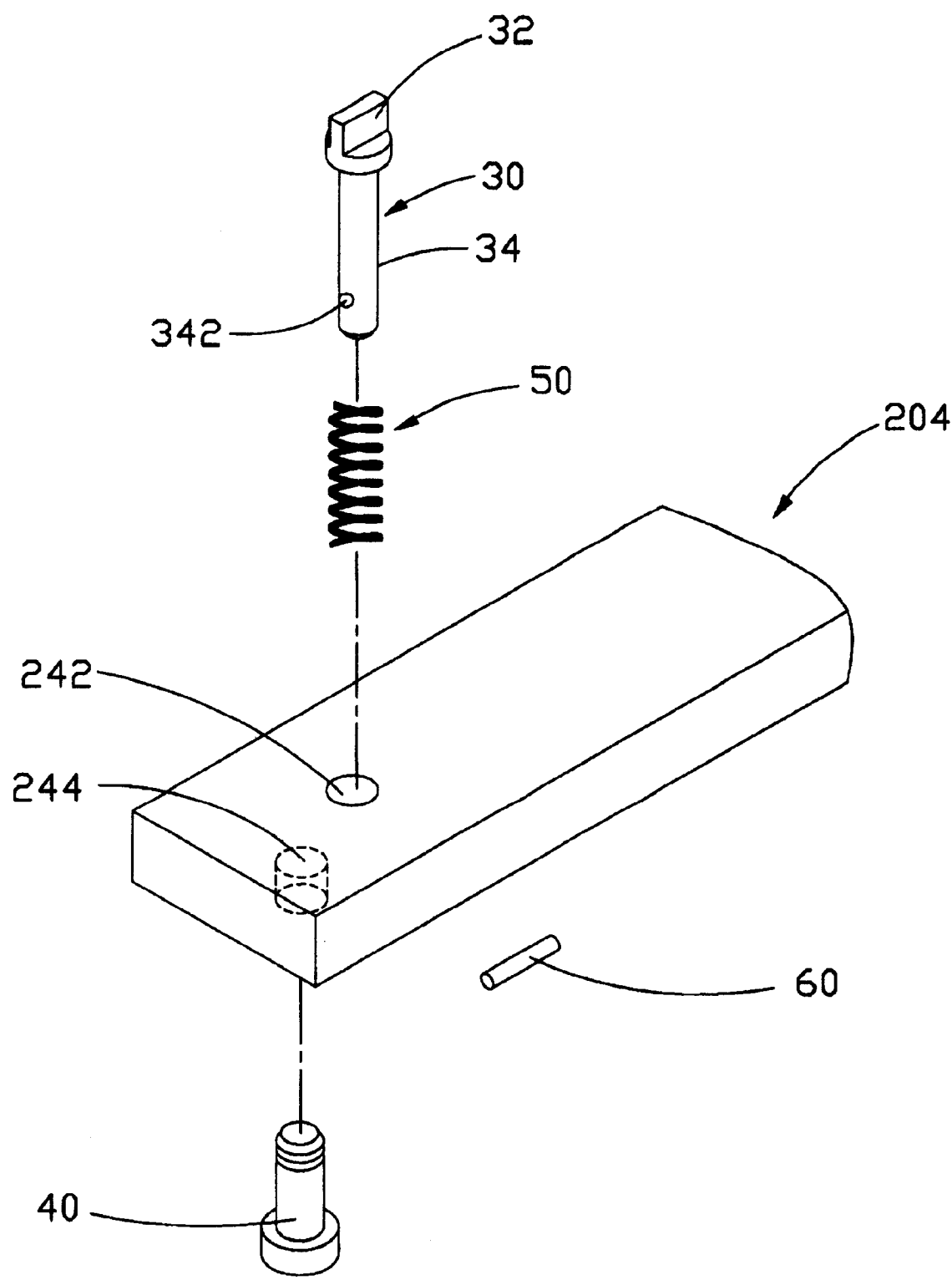
FIG. 4 is an enlarged, exploded, isometric view of some of the parts shown in FIG. 2.

Each supporting plate 20 comprises an upper sliding support 202, a lower sliding support 204, and a supporting body 206 therebetween. The upper sliding support 202 and the lower sliding support 204 have a same structure. Therefore, only the lower sliding support 204 is described in detail herebelow. Referring also to FIG. 4, only a part of the lower sliding support 204 is shown. The lower sliding support 204 defines a through hole 242 and a threaded hole 244 in each of opposite end portions thereof. A lateral displacement between the through hole 242 and the threaded hole 244 is the same as a distance between the guiding slot 105 and the positioning slot 104. The supporting body 206 is generally plate-shaped, and comprises a plurality of parallel retaining ribs 208 on an inner face thereof. Thus two of the supporting plates 20 face each other, with the retaining ribs 208 thereof being symmetrically opposite each other. The retaining ribs 208 cooperate with each other to retain a plurality of substrates therebetween.

Figure 5:
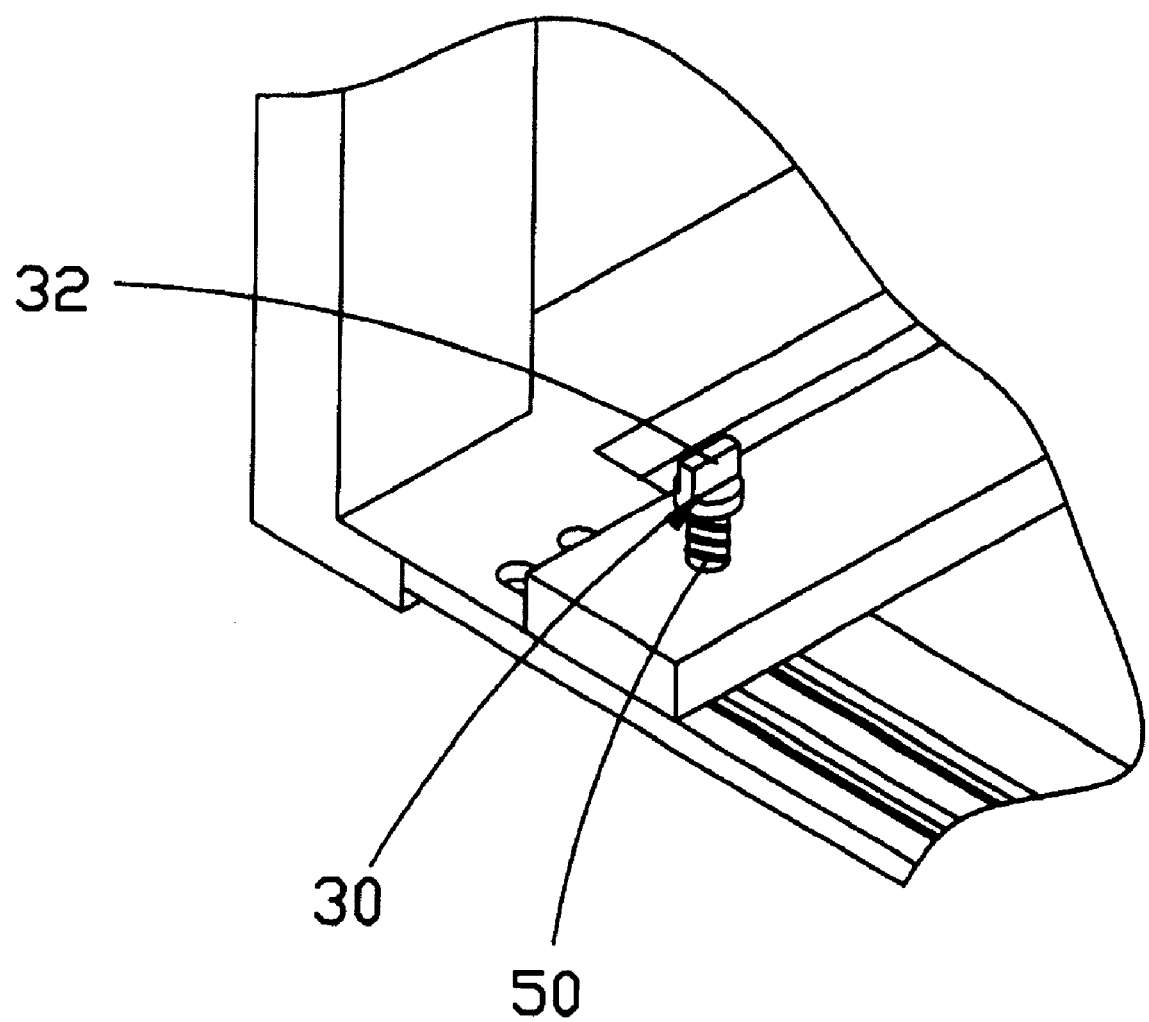
FIG. 5 is similar to FIG. 2, but viewed from another aspect.

Referring also to FIG. 5, each positioning pin 30 comprises a head 32 at one end, a main body 34 defining a stopper hole 342 in an end thereof distal from the head 32, and a stopper 60 received in the stopper hole 342. A diameter of the head 32 is larger than that of the through hole 242, and a diameter of the main body 34 is slightly less than the diameter of the through hole 242. One coil spring 50 is engaged around the main body 34 between the head 32 and the stopper hole 342. The coil spring 50 is compressed to enable the stopper 60 to be received in the stopper hole 342 below the lower sliding support 204.

Each screw bolt 40 comprises a head (not labeled) and a main body (not labeled). A diameter of the head is larger than a width of the guiding slot 105, and a diameter of the main body is slightly less than the width of the guiding slot 105.

The positioning pins 30 and the screw bolts 40 are used for assembling the frame 10 and the supporting plates 20 together and thereby forming the cassette 1.

In assembly, one pair of the supporting plates 20 is placed in the space of frame 10, with the retaining ribs 208 thereof facing inwardly toward each other. The through holes 242 and the threaded holes 244 of the upper and lower sliding supports 202, 204 are aligned with the corresponding positioning slots 104 and guiding slots 105 respectively. Eight screw bolts 40 are passed through the guiding slots 105 from an outside of the frame 10 and engaged in corresponding threaded holes 244. The main bodies 34 of the positioning pins 30 are passed through the corresponding through holes 242 and the positioning slots 104 from an inside of the frame 10, and the stoppers 60 are engaged in the stopper holes 342. The coil springs 50 are thereby compressed, and the stoppers 60 are engaged in selected keyways 106. Finally, the supporting plates 20 can be even further secured by tightening the screw bolts 40. Thus the frame 10 and both pairs of the supporting plates 20 are firmly joined together.

Mounting each positioning pin 30 in the above-described assembly procedure comprises the following steps. First, the main body 34 with the coil spring 50 engaged therearound is extended into the through hole 242. Second, the head 32 is pressed to expose the stopper hole 342 beyond an outer side of the corresponding upper or lower sliding support 202, 204, and the stopper 60 is inserted into the stopper hole 342. The coil spring 50 is also thereby compressed. Third, pressure on the head 32 is released, so that the coil spring 50 decompresses and drives the stopper 60 to engage in a selected pair of keyways 106.

When the size of a substrate is larger or smaller than the distance between the two opposing supporting plates 20, the cassette 1 can be adjusted to fit the substrate. Normally only one of the two supporting plates 20 needs to be repositioned, as follows. The screw bolts 40 are unscrewed slightly so that they are slidable along the guiding slots 105. The heads 32 are pressed so that the stoppers 60 are disengaged from the keyways 106. The supporting plate 20 is slid along the upper and lower supports 101, 102 until the distance between the supporting plates 20 corresponds to the size of the substrate. Pressure on the heads 32 is released, so that the coil springs 50 decompress and drive the stoppers 60 to engage in appropriate selected keyways 106. Finally, the screw bolts 40 are tightened.

The cassette 1 of the present invention provides the above-described sliding and fixing means, which essentially comprise the positioning pins 30, the screw bolts 40, the positioning and guiding slots 104, 105, and the through and threaded holes 242, 244. The sliding and fixing means enable easy adjustment of the distance between two opposite supporting plates 20. In the adjusting process, no part need be detached from the cassette 1. The risk of misplacing loose parts is eliminated, and the adjusting process is simple and speedy.

It is to be understood, however, than even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

The invention claimed is:

1. An adjustable cassette for configured for accommodating substrates, comprising:
    a frame having two guiding slots in each of two opposite sides thereof respectively;
    a pair of supporting plates with a plurality of retaining ribs facing towards each other, at least one of the supporting plates defining two threaded holes in each of opposite end portions thereof corresponding to the guiding slots, respectively, each guiding slot extending along a direction oriented from one of the supporting plates to the other one of the supporting plates; and
    a plurality of screw bolts passed through the guiding slots and engaged in corresponding threaded holes, wherein at least one supporting plate can be moved away from or close to another supporting plate by way of sliding the screw bolts along the guiding slots and can be fixed by means of the screws bolts.

2. The adjustable cassette as described in claim 1, wherein each screw bolt comprises a head and a main body, a diameter of the head of the screw bolt is larger than a width of the guiding slot, and a diameter of the main body of the screw bolt is slightly less than the width of the guiding slot.

3. The adjustable cassette as described in claim 1, wherein the frame further defines at least one positioning slot having a plurality of pairs of keyways at opposite sides thereof respectively.

4. The adjustable cassette as described in claim 3, wherein the pairs of keyways are spaced apart from one another at predetermined distances.

5. The adjustable cassette as described in claim 3, wherein said at least one of the supporting plates defines at least one through hole in an end portion thereof corresponding to said positioning slot.

6. The adjustable cassette as described in claim 5, wherein a lateral displacement between said through hole and a corresponding threaded hole is the same as a distance between said positioning slot and a corresponding guiding slot.

7. An adjustable cassette configured for accommodating substrates, comprising:
- a frame defining two guiding slots in each of two opposite sides thereof respectively and at least one positioning slot having a plurality of pairs of keyways at opposite sides thereof respectively;
- a pair of supporting plates with a plurality of retaining ribs facing toward each other, wherein at least one of the supporting plates defining two threaded holes in each of opposite end portions thereof corresponding to said guiding slots respectively and at least one through hole in an end portion thereof corresponding to said positioning slot and wherein a lateral displacement between said through hole and a corresponding threaded hole is the same as a distance between said positioning slot and a corresponding guiding slot;
- a plurality of screw bolts passed through the guiding slots and engaged in corresponding threaded holes, wherein at least one supporting plate can be moved away from or close to another supporting plate by way of moving the screw bolts along the guiding slots and can be fixed by means of the screws bolts; and
- at least one positioning pin received in said through hole and said positioning slot.

8. The adjustable cassette as described in claim 7, further comprising at least one coil spring, and wherein said positioning pin comprises a head at one end, a main body defining a stopper hole in an end thereof distal from the head, and a stopper received in the stopper hole, and said coil spring is engaged around the main body of said positioning pin.

9. The adjustable cassette as described in claim 8, wherein a diameter of the head is greater than a diameter of said through hole, and a diameter of the main body is slightly less than the diameter of said through hole.

10. The adjustable cassette as described in claim 9, wherein the main body of said positioning pin passes through said through hole and said positioning slot, and said stopper is engaged in the stopper hole.

11. An adjustable cassette configured for accommodating substrates, comprising:
- a frame comprising two positioning slots at each of two opposite sides thereof, the positioning slots having a plurality of pairs of keyways;
- a pair of supporting plates having a plurality of retaining ribs facing each other, at least one of the supporting plates defining two through holes in each of opposite end portions thereof corresponding to the positioning slots respectively; and
- a plurality of positioning pins located in the through holes and the positioning slots,
- wherein at least one supporting plate can be moved away from or close to another supporting plate by way of moving the positioning pins along the positioning slots and can be fixed by means of the positioning pins.

12. The adjustable cassette as described in claim 11, wherein the pairs of keyways are spaced apart from one another at predetermined distances.

13. The adjustable cassette as described in claim 12, further comprising a plurality of a coil springs, and wherein each of the positioning pins comprises a head at one end, a main body defining a stopper hole in an end thereof distal from the head, and a stopper received in the stopper hole, and each of the coil springs is engaged around the main body of a corresponding positioning pin.

14. The adjustable cassette as described in claim 13, wherein the main bodies of the positioning pins pass through corresponding through holes and corresponding positioning slots, and the stoppers are engaged in the stopper holes.

15. An adjustable cassette configured for accommodating substrates, comprising:
- a frame;
- a pair of supporting plates wit a plurality of retaining members facing each other; and
- an adjusting means for joining of the supporting plates to the frames and thereby forming the cassette, wherein at least one supporting plate can slide away from or close to another supporting plate along a direction oriented from one of the supporting plates to the other one of supporting plates and can be fixed by means of the adjusting means.

16. The adjustable cassette as described in claim 15, wherein the adjusting means comprises two guiding slots defined in each of two opposite sides of the frame, two threaded holes defined in each of opposite end portions of at least one of the supporting plates corresponding to guiding slots respectively, and a plurality of screw bolts passed through the guiding slots and engaged in corresponding threaded holes, and wherein said guiding slots extending along the direction oriented from one of the supporting plates to the other one of the supporting plates.

17. The adjustable cassette as described in claim 15, wherein the adjusting means comprises two positioning slots defined at each of two opposite sides of the frame, two through boles in each of opposite end portions of at least one of the supporting plates corresponding to the positioning slots respectively, and a plurality of positioning pins located in the through holes and positioning slots, and wherein said positioning slots extending along the direction oriented from one of the supporting plates to the other one of supporting plates.

18. The adjustable cassette as described in claim 15, wherein said adjustable means is moveable relative to both the frame and the supporting plate in a first direction, and said supporting plate is moveable relative to the frame in a second direction perpendicular to said first direction, and said supporting plate is moveable relative to the other support plate in a third direction perpendicular to both said first and second directions.

* * * * *